(12) United States Patent
Choi et al.

(10) Patent No.: US 7,825,970 B2
(45) Date of Patent: Nov. 2, 2010

(54) CMOS IMAGE SENSOR AND IMAGE SENSING METHOD USING THE SAME

(75) Inventors: Sung-Ho Choi, Seoul (KR); Jung-Chak Ahn, Suwon-si (KR); Yi-Tae Kim, Hwaseong-si (KR); Young-Chan Kim, Seongnam-si (KR); Hae-Kyung Kong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 255 days.

(21) Appl. No.: 11/826,588

(22) Filed: Jul. 17, 2007

(65) Prior Publication Data

US 2008/0018765 A1  Jan. 24, 2008

(30) Foreign Application Priority Data

Jul. 19, 2006 (KR) .................... 10-2006-0067198

(51) Int. Cl.
*H04N 3/14* (2006.01)
*H04N 5/335* (2006.01)
(52) U.S. Cl. .................... 348/275; 348/266; 348/294
(58) Field of Classification Search .................... None
See application file for complete search history.

(56) References Cited

U.S. PATENT DOCUMENTS 6,657,665 B1  12/2003  Guidash

2004/0218078 A1  11/2004  Lee
2005/0110093 A1*  5/2005  Altice et al. ................ 257/359
2006/0118837 A1*  6/2006  Choi .......................... 257/292

FOREIGN PATENT DOCUMENTS

| JP | 2004-056048 | 2/2004 |
| JP | 2004-336006 | 11/2004 |
| KR | 102004006486 | 1/2004 |
| KR | 1020040093947 | 11/2004 |
| KR | 10-2006-0063244 | 12/2006 |

OTHER PUBLICATIONS

Korean Office Action dated Jul. 18, 2007.
English translation of Korean Office Action dated Jul. 18, 2007.

* cited by examiner

*Primary Examiner*—David L Ometz
*Assistant Examiner*—Angel L Garces-Rivera
(74) *Attorney, Agent, or Firm*—Harness, Dickey & Pierce, P.L.C.

(57) ABSTRACT

Example embodiments may provide a CMOS image sensor. The CMOS image sensor may include a plurality of unit blocks each including two unit pixels. Each unit block may include two photodiodes having a hexagonal shape, a floating diffusion shared by the two unit pixels, a first transfer transistor and a second transfer transistor between the floating diffusion and the two photodiodes, respectively, a reset transistor connected with the floating diffusion, a drive transistor with a gate connected with the floating diffusion, and/or a selection transistor connected to the drive transistor in series. Example embodiment CMOS image sensors may be used in digital cameras, mobile devices, computer cameras, or the like.

21 Claims, 16 Drawing Sheets

MICROLENS TYPE ON RECTANGULAR STRUCTURE

MICROLENS TYPE ON HEXAGONAL STRUCTURE

AREA OF REGULAR HEXAGON
$(3^{0.5} * 3/2) * R^2$

Pixel Pitch
$(3^{0.5} * 1/2) * R$

AREA OF SQUARE : $X^2$

Pixel Pitch : X

Simultaneous Read out of First & Third Rows

Simultaneous Read out of Second & Fourth Rows

Real Pixel | Virtual Pixel

Real Green Pixel

Real Blue Pixel

Real Red Pixel

Virtual Pixel Between Green pixels

Virtual Pixel Between Blue pixels

Virtual Pixel Between Red pixels

Real Pixel   Virtual Pixel

Real Green Pixel

Real Blue Pixel

Real Red Pixel

Virtual Pixel Between Green pixels

Virtual Pixel Between Blue pixels

Virtual Pixel Between Red pixels

CMOS IMAGE SENSOR AND IMAGE SENSING METHOD USING THE SAME

PRIORITY STATEMENT

This application claims the priority of Korean Patent Application No. 2006-0067198, filed on Jul. 19, 2006, in the Korean Intellectual Property Office, the disclosure of which is incorporated herein in its entirety by reference.

BACKGROUND

1. Field

Example embodiments may provide a CMOS image sensor, for example, a CMOS image sensor having a honeycomb structure in which photodiodes may have a hexagonal shape and two unit pixels may share a floating diffusion (FD).

2. Description of the Related Art

In a related art charge coupled device (CCD) or CMOS image sensor (CIS), a photodiode (PD) may convert incident light into an electric signal based on the light's wavelength. It is desirable to collect incident light with a quantum efficiency of 1 with respect to all wavelength bands, that is, all of incident light is collected.

A unit pixel in a related art CIS may include a single PD and four transistors. The four transistors may include a transfer transistor that may transfer photo-generated charge collected at the PD to an FD, a reset transistor which may reset the FD by setting an electric potential of a node to a desired value and discharging the charge, a drive transistor which may function as a source follower buffer amplifier, and/or a selection transistor which may enable addressing through switching.

As size of related-art CIS's decrease, the size of an active pixel sensor receiving light may also decrease. A PD, which is influences characteristics of the CIS, may need to remain at a set size even if the size of an active pixel sensor is decreased. Sharing a circuit may overcome this problem.

If unit pixels in a pixel array have a square shape and a degree of integration increases to achieve higher resolution, the length of a pixel array may increase, potentially resulting in increased parasitic resistance and/or parasitic capacitance. A pixel pitch between unit pixels may also increase. An image sensor having a honeycomb structure may prevent or reduce these problems. A pixel architecture in which unit pixels share a circuit in the honeycomb structure may be desired.

SUMMARY

Example embodiments may provide a CMOS image sensor with reduced size using a shared floating diffusion design in which unit pixels may share a circuit.

Example embodiments may also provide a CMOS image sensor capable of performing a pixel summation mode and/or draining overflow at a white level (high level intensity of illumination).

Example embodiments may provide a CMOS image sensor including a plurality of unit blocks each including two unit pixels. Each unit block may include two photodiodes having a hexagonal shape, a floating diffusion shared by the two unit pixels, a first transfer transistor and/or a second transfer transistor between the floating diffusion and the two photodiodes, respectively, a reset transistor connected with the floating diffusion, a drive transistor whose gate may be connected with the floating diffusion, and/or a selection transistor connected with the drive transistor in series.

The photodiodes having the hexagonal shape may form a honeycomb structure.

The two unit pixels in the unit block may include a first unit pixel positioned on a k-th column and an n-th row in the honeycomb structure and a second unit pixel on the k-th column and an (n+2)-th row in the honeycomb structure, where "k" and "n" are positive integers.

The unit block may include two overflow transistors each connected with photodiodes to provide overflow drains.

One transistor of the two overflow transistors may be connected with a power supply voltage, and the other transistor of the two overflow transistors may be connected with a floating diffusion in an adjacent unit block.

If data is read from a first unit pixel among the two unit pixels in the unit block, an overflow transistor connected with a photodiode in a second unit pixel may be slightly turned on to provide an overflow drain in the second unit pixel, and first and second transfer transistors in an adjacent unit block may be slightly turned on to provide overflow drains from the adjacent unit block.

Each of the unit pixels may include a microlens above one of the photodiodes to receive light and/or a color filter between the photodiode and the microlens to filter the light received by the microlens.

Color filters corresponding to the photodiodes in the unit block may filter the same color.

Color filters for a first color, a second color, and/or a third color may be sequentially arranged on an n-th row in a honeycomb structure, and color filters for the third color, the first color, and the second color may be sequentially arranged on an (n+1)-th row in the honeycomb structure, where "n" is a positive integer.

Color filters for a first color and a second color may be sequentially arranged on an n-th row in a honeycomb structure, and color filters for only a third color may be arranged on an (n+1)-th row in the honeycomb structure, where "n" a positive integer.

The first, second, and/or third colors may be blue, red, and/or green.

Example embodiments may provide a CMOS image sensor, in which photodiodes may form a honeycomb structure. The CMOS image sensor may includes a plurality of unit blocks each including two unit pixels. Each unit block may include two photodiodes having a hexagonal shape, a floating diffusion shared by the two unit pixels, a first transfer transistor and a second transfer transistor respectively between the floating diffusion and the two photodiodes, a reset transistor connected with the floating diffusion, a drive transistor whose gate may be connected with the floating diffusion, and/or a selection transistor connected with the drive transistor in series. If the unit block is read, the CMOS image sensor may sum charge generated by the two photodiodes in the unit block and may output a voltage generated by the summed charge as an output voltage to support a pixel summation mode.

The unit block may include two overflow transistors each connected with two photodiodes to provide overflow drains. One transistor of the two overflow transistors may be connected with a power supply voltage, and the other transistor of the two overflow transistors may be connected with a floating diffusion in an adjacent unit block.

If the unit block is read, first and second transfer transistors in an adjacent unit block may be slightly turned on to provide overflow drains in the adjacent unit block to support the pixel summation mode.

For example, a digital camera, computer camera, or mobile terminal including an example embodiment CMOS image sensor may include an image processor that receives data output from the CMOS image sensor and performs image processing of the received data.

Example embodiments may provide an image sensing method for a CMOS image sensor including a plurality of hexagonal unit blocks, each of which may include a first unit pixel and a second pixel unit that may include photodiodes. Example embodiment image sensing methods may include selecting the first unit pixel, transferring charge generated by the photodiode in the first unit pixel to a first floating diffusion in a unit block including the first unit pixel, transferring a slight amount of charge, which may be generated by photodiodes in respective two unit pixels in an adjacent unit block connected to the first floating diffusion, to a second floating diffusion in the adjacent unit block to drain overflow, transferring a slight amount of charge, which may be generated by the photodiode in the second unit pixel, to a power supply voltage and/or a floating diffusion in another adjacent unit block to drain overflow, and/or reading charge from the first floating diffusion.

Example embodiments may provide an image sensing method for a CMOS image sensor including a plurality of hexagonal unit blocks, each of which may include a first unit pixel and a second pixel unit that may each include photodiodes. Example embodiment image sensing methods may include selecting a unit block, transferring charge, which may be generated by two photodiodes in the selected unit block, to a first floating diffusion in the unit block, transferring a slight amount of charge, which may be generated by photodiodes in two unit pixels in an adjacent unit block connected to the first floating diffusion, to a second floating diffusion in the adjacent unit block, and reading charge from the first floating diffusion.

BRIEF DESCRIPTION OF THE DRAWINGS

The above and other features and/or advantages of example embodiments will become more apparent by describing them in detail with reference to the attached drawings in which.

DETAILED DESCRIPTION

Figure 1A:
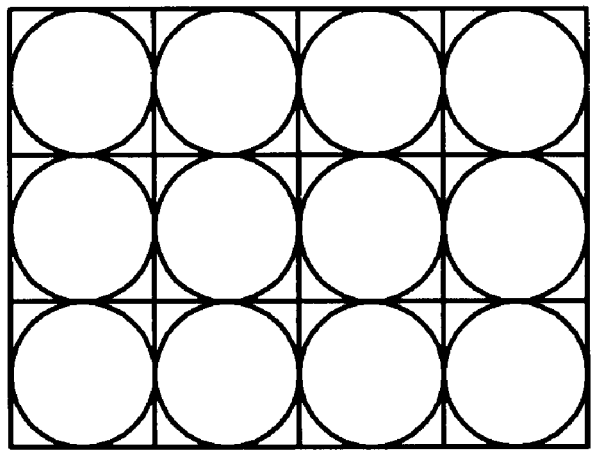
FIG. 1A illustrates a microlens mounted on related art rectangular-shaped photodiodes.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and/or scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
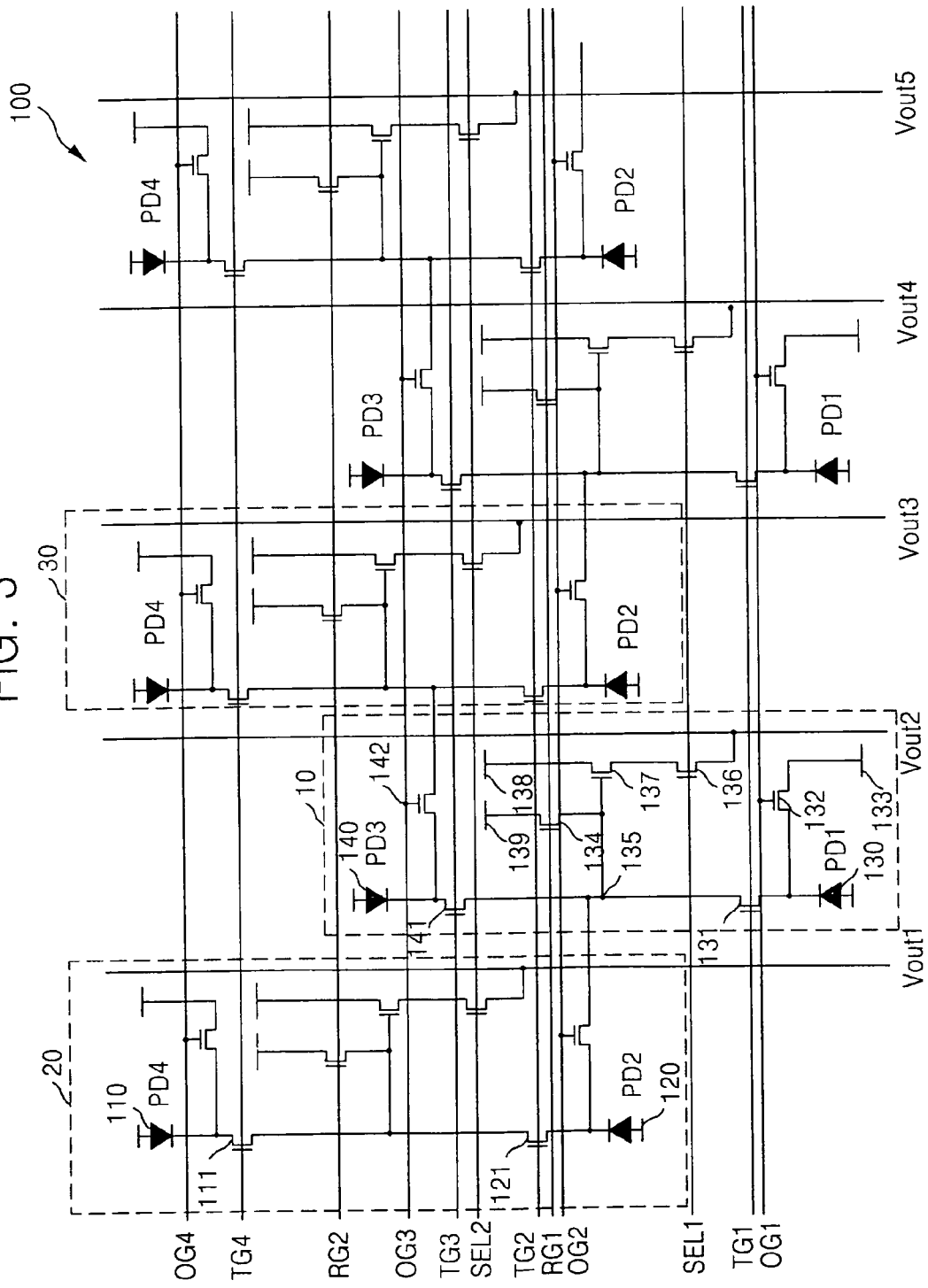
FIG. 3 is a circuit diagram of an example embodiment CMOS image sensor.

FIG. 3 is a circuit diagram of an example embodiment CMOS image sensor 100. The CMOS image sensor 100 may include a plurality of unit blocks 10 and 20 that each may include two unit pixels. The two unit pixels may be, for example, a unit pixel including a first photodiode (PD) 130 and/or a unit pixel including a third PD 140. The unit blocks 10 and 20 may have similar structures.

The unit block 10 may include two PDs 130 and 140 having a hexagonal shape, a floating diffusion (FD) 135 shared by the two unit pixels, a first transfer transistor 131 between the PD 130 and the FD 135, a third transfer transistor 141 between the PD 140 and the FD 135, a reset transistor 134 connected with the FD 135, a drive transistor 137 with a gate connected with the FD 135, and/or a selection transistor 136 connected in series with the drive transistor 137. The reset transistor 134 and the drive transistor 137 may be connected with power supply voltages 139 and 138, respectively. If the two unit pixels share the FD 135, the reset transistor 134, the drive transistor 137, and/or the selection transistor 136, the CMOS image sensor 100 may be smaller than a related art CMOS image sensor having similar resolution. The PDs 130 and 140 may receive light and generate photo-generated charge.

The first and third transfer transistors 131 and 141 may transfer photo-generated charge collected at the PDs 130 and 140 to the FD 135. The FD 135 may store the photo-generated charge transferred by the first and third transfer transistors 131 and 141.

Figure 4:
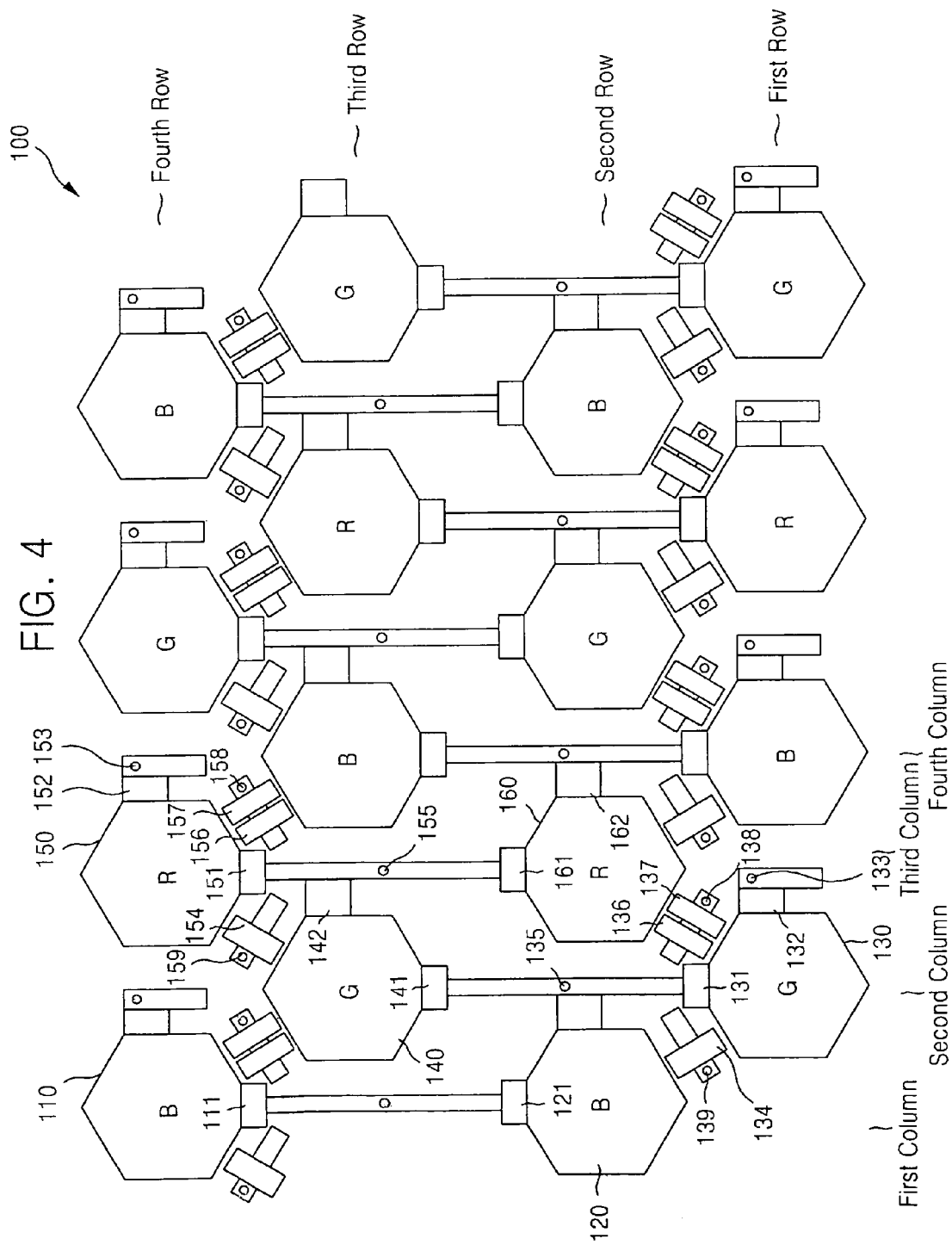
FIG. 4 illustrates the layout of an example embodiment CMOS image sensor.
Figure 5:
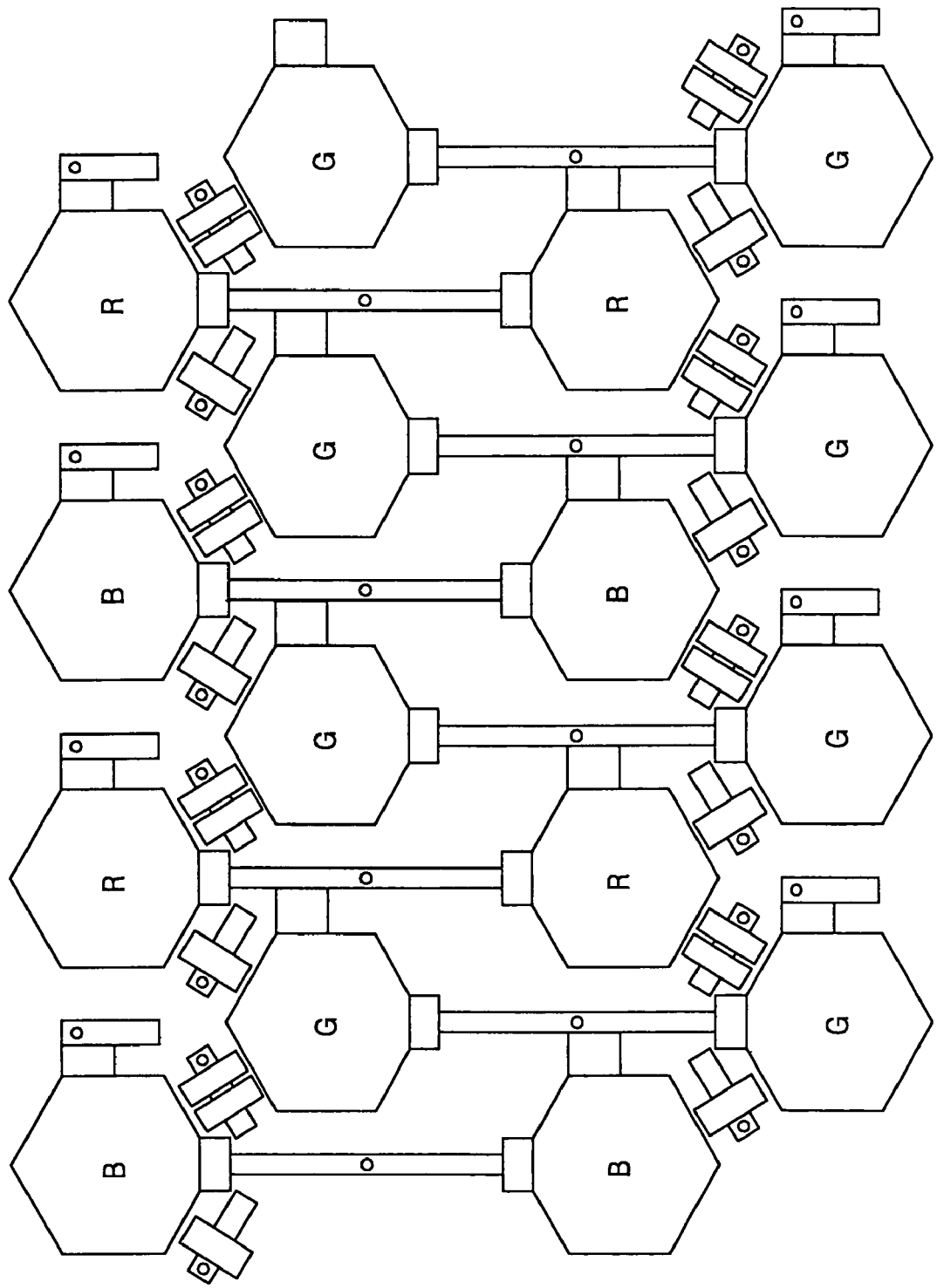
FIG. 5 illustrates the layout of an example embodiment CMOS image sensor.

The reset transistor 134 may reset the FD 135. The drive transistor 137 may function as a source follower buffer amplifier. The selection transistor 136 may enable addressing through switching. PDs having the hexagonal shape may form a honeycomb structure as illustrated in FIG. 4 or 5.

Figure 1B:
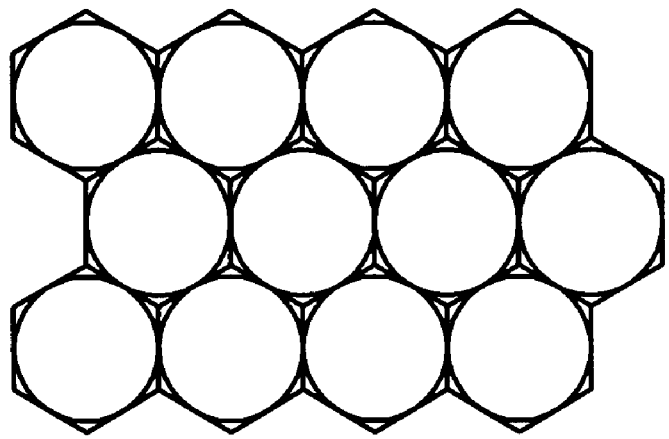
FIG. 1B illustrates an example embodiment microlens mounted on photodiodes having a hexagonal shape.

FIG. 1A illustrates a related art microlens mounted on related art rectangular-shaped PDs. FIG. 1B illustrates an example embodiment microlens mounted on PDs having a hexagonal shape.

As shown in FIGS. 1A and 1B, dead space may be larger if a related art microlens is mounted on PDs having a rectangular shape as illustrated in FIG. 1A than if a microlens is mounted on PDs having a hexagonal shape as illustrated in FIG. 1B. If a hexagonal-shaped PD and a rectangular-shaped PD have the same area, dead space of the hexagonal-shaped PD may be about 13.5% while dead space of the rectangular-shaped PD may be about 21.5%. That is, the dead space of the hexagonal-shaped PD may be decreased by 8% compared to the dead space of the rectangular-shaped PD.

If light emitted from an object is collected by an image pickup lens optical system and focused by a microlens onto a PD, the fill-factor of a hexagonal-shaped PD may be greater than that of a rectangular-shaped PD. If a hexagonal-shaped PD is used, a pitch between pixels may be less than if the rectangular-shaped PD is used.

Figure 2A:
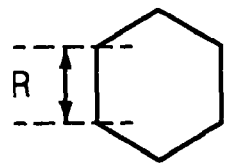
FIGS. 2A and 2B illustrate an example embodiment pixel pitch in a pixel array.
Figure 2B:
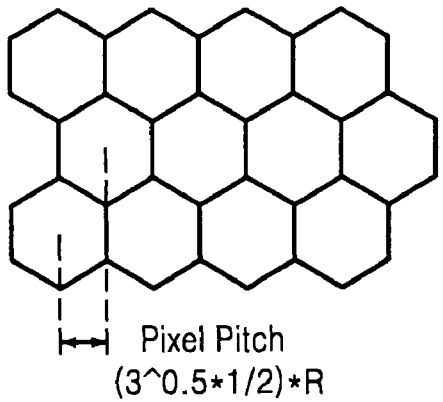
Figure 2C:
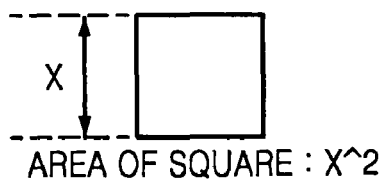
FIGS. 2C and 2D illustrate a pixel pitch in a related art pixel array including photodiodes having a rectangular shape.
Figure 2D:
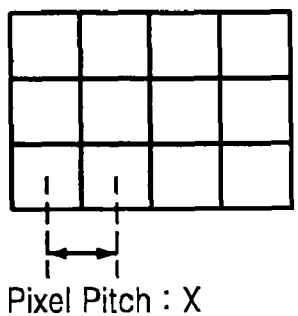

FIGS. 2A and 2B illustrate an example embodiment pixel pitch in a pixel array. FIGS. 2C and 2D illustrate a pixel pitch in a conventional pixel array including photodiodes having a rectangular shape.

As shown in FIGS. 2A and 2B, if a length of one side of a regular hexagon is represented with "R", the area of a PD having a regular hexagonal shape is $$\sqrt{3}\frac{3}{2}R^2.$$

A pitch between pixels including a PD having a regular hexagonal shape is calculated as $$\frac{\sqrt{3}}{2}R.$$

As shown in FIGS. 2C and 2D, if a length of one side of a square is represented with "X", the area of a PD having a square shape is calculated as $X^2$. A pitch between pixels including a PD having a square shape is expressed by X.

Table 1 shows the comparison of a pixel pitch between a PD having a regular hexagonal shape and a PD having a square shape when the PDs have the same area.

TABLE 1

| Area of PD (µm²) | Pixel pitch (µm) for PD having square shape | Pixel pitch (µm) for PD having regular hexagonal shape | Length (µm) of one side of hexagon |
|---|---|---|---|
| 31.4 | 5.6 | 3.0 | 3.5 |
| 16 | 4 | 2.1 | 2.5 |
| 14.4 | 3.8 | 2.0 | 2.4 |
| 7.8 | 2.8 | 1.5 | 1.7 |

As shown in Table 1, for a particular area of PDs, a pixel pitch for a PD having a regular hexagonal shape may be less than that for a PD having a square shape. If an image signal, for example, an image signal having a stripe pattern, is displayed, pixels including a PD having a regular hexagonal shape may display the image more clearly.

If a honeycomb structure is used, the dead space of a PD be reduced, and an image signal having a stripe pattern may be more clearly displayed as well because a pixel pitch in a hexagonal structure may be less than that in a square structure.

FIG. 4 illustrates the layout of an example embodiment CMOS image sensor 100. The circuit diagram illustrated in FIG. 3 corresponds to the layout illustrated in FIG. 4. As shown in FIGS. 3 and 4, if among the two unit pixels in the unit block 10, the first unit pixel includes the PD 130 and the second unit pixel includes the PD 140, the first unit pixel may be on a k-th (for example, 2nd or 5th) column, and an n-th (for example, 1st or 4th) row and the second unit pixel may be on the k-th column and an (n+2)-th (for example, 3rd or 6th) row, in the honeycomb structure. The two unit pixels in each unit block may be on the same column at an interval of two rows. Here, "n" is a natural number less than m−1 if a pixel array includes a total of "m" rows.

Each of the first and second unit pixels may include a microlens (not shown), which may be above the first or second unit pixel to receive light, and/or a color filter (not shown), which may be between the PD 130 or 140 and the microlens to filter the light received by the microlens. Color filters corresponding to the respective PDs 130 and 140 having a hexagonal shape in the unit block 10 may filter the same colors, for example, green and/or red. Two unit pixels in each unit block may include the same color filters, for example, green (G) color filters, red (R) color filters, or blue (B) color filters.

If two unit pixels in a single unit block include the same color filters, pixel summation may be accomplished through an FD shared by the two unit pixels.

A first, second, and third color filter, for example, a blue, red, and green color filter, may be sequenced and/or repeated on a second row in the honeycomb structure. Third, first, and second color filters, for example, green, blue, and red color filters, may be sequenced and/or repeated on a third row in the honeycomb structure.

As shown in FIG. 4, blue (B), red (R), and/or green (G) color filters may be sequenced and/or repeated on a second row and G, B, and/or R color filters may be sequenced and/or repeated on a third row. A sequence of the color filters on the second row may not necessarily be B, R, and/or G. It may be desirable that a color filter on the first column and the second row, a color filter on the third column and the second row, and a color filter on the second column and the third row each filter different colors, for example, B for a PD 120, R for a PD 160, and G for a PD 140.

FIG. 5 illustrates the layout of an example embodiment CMOS image sensor. The layout illustrated in FIG. 5 is similar to that illustrated in FIG. 4, with the exception of the arrangement of color filters. In the honeycomb structure illustrated in FIG. 5, first and second color filters, for example, B and/or R color filters, may be sequenced and/or repeated on the second row and a third color filter, for example, a G color filter, may be repeated on the third row. It may be desirable for the third color to be green, but any color may be used.

Green color filters may be used more than any other color filters in the honeycomb structure illustrate in FIG. 5 because human eyes may be more sensitive to green and thus may perceive that a picture is clearer. Green color filters may absorb ultraviolet rays that may be harmful to human eyes, reduce the dazzling effects caused by intense light, and/or reduce eye fatigue.

As shown in FIG. 3, the unit block 10 may include two overflow transistors 132 and 142, which may be respectively connected with the PDs 130 and 140 to drain the overflow of charge. Among the two overflow transistors 132 and 142, one may be connected with a power supply voltage 133 and the other may be connected with an FD in an adjacent unit block 30.

If a CMOS image sensor is at a white level, a high level intensity of illumination, the overflow of photo-generated charge may occur at each PD. If the overflow occurs, the charge may flow into other unit pixels, disturbing the image display. For example, if photo-generated charge in the first PD 130 overflows to the first FD 135 if the first transfer transistor 131 is not turned on, data may be unclearly read from the unit pixel including the third PD 140 due to the overflow of the photo-generated charge.

In order to prevent or reduce such overflow, the two overflow transistors 132 and 142 may be used to drain the overflow. For such overflow drain function, it may be desirable for the overflow transistors 132 and 142 and second and fourth transfer transistors 121 and 111 in the unit block 20 adjacent to the unit block 10 to perform voltage control.

Figure 6A:
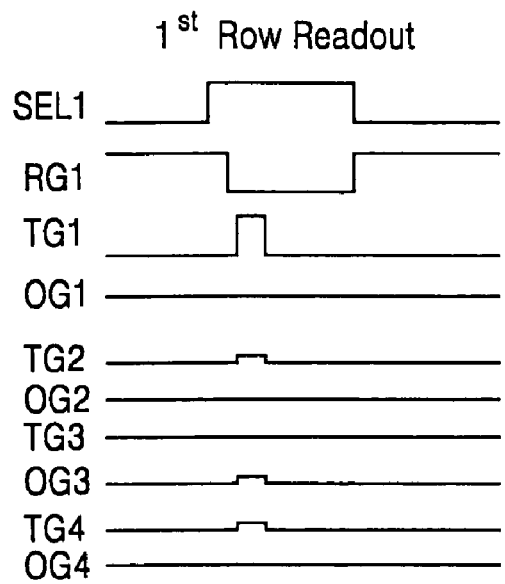
FIGS. 6A through 6D are timing charts of data readout in an example embodiment CMOS image sensor.

FIGS. 6A through 6D are timing charts of data readout in an example embodiment CMOS image sensor. FIG. 6A is a timing chart of an operation in which data may be read from the unit pixel including the first PD 130. The overflow drain function will be described with reference to FIG. 6A below.

If data is read from the unit pixel including the first PD 130 in the unit block 10, an entire row including the unit pixel including the first PD 130 may be selected, and the first selection transistor 136 may be turned on by transiting a selection signal SEL1 for controlling the first selection transistor 136 from a low level to a high level and transiting a reset signal RG1 for controlling the first reset transistor 134 from a high level to a low level. PDs that may be read by the first selection transistor 136 may be the two first and third PDs 130 and 140. Only the first transfer transistor 131 connected with the first PD 130 may be turned on. To do so, the first transfer signal TG1 for controlling the first transfer transistor 131 may be at a high level for a period of time. The third overflow transistor 142 may be slightly turned on to prevent or reduce overflow of the third PD 140. To slightly turn on the third overflow transistor 142, a signal OG3 having a voltage between a low level voltage and a high level voltage may be applied to the third overflow transistor 142, as illustrated in FIG. 6A. The voltage may be closer to the low level voltage than to the high level voltage. In order to prevent or reduce the overflow of the two PDs 110 and 120 in the adjacent unit block 20 connected with the first FD 135 in the unit block 10, the second and fourth transfer transistors 121 and 111 may be slightly turned on. For this operation, signals TG2 and TG4 applied respectively to a gate of the second and fourth transfer transistor 121 and 111 may have a voltage level similar to the signal OG3.

If the unit pixel including the first PD 130 is read, only photo-generated charge of the first PD 130 may be stored in the first FD 135. The third overflow transistor 142 in the unit pixel including the third PD 140 may be slightly turned on in the unit block 10, and the two transfer transistors 111 and 121 may be slightly turned on in the adjacent unit block 20 connected to the first FD 135.

Figure 6B:
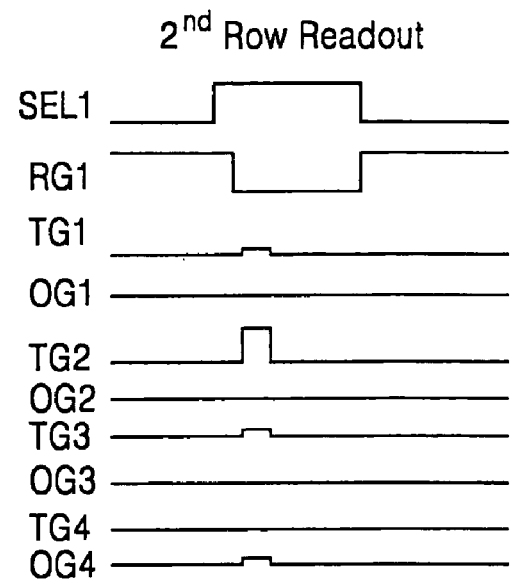
Figure 6C:
Figure 6D:
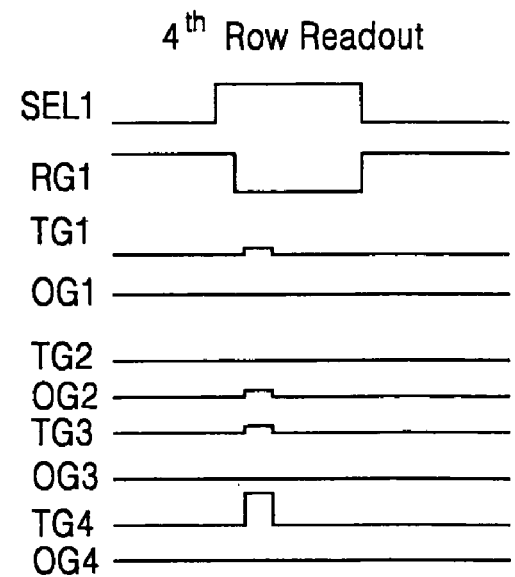

FIGS. 6B through 6D are timing charts of operations in which data may be read from unit pixels, of the second, third, and fourth PDs 120, 140, and 110. These operations may be similar to the operation described with reference to FIG. 6A.

Figure 7A:
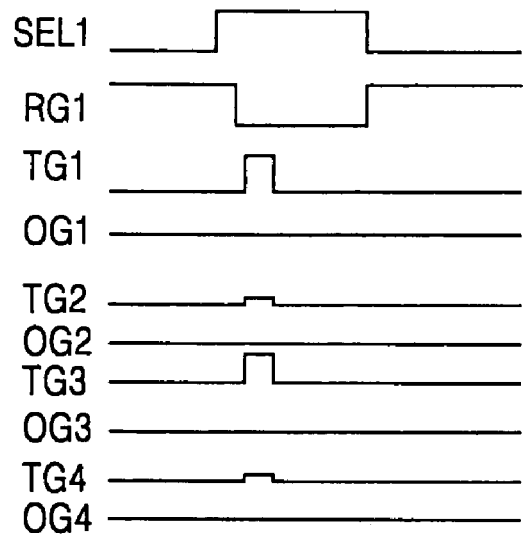
FIGS. 7A and 7B are timing charts of a pixel summation mode of an example embodiment CMOS image sensor.
Figure 7B:
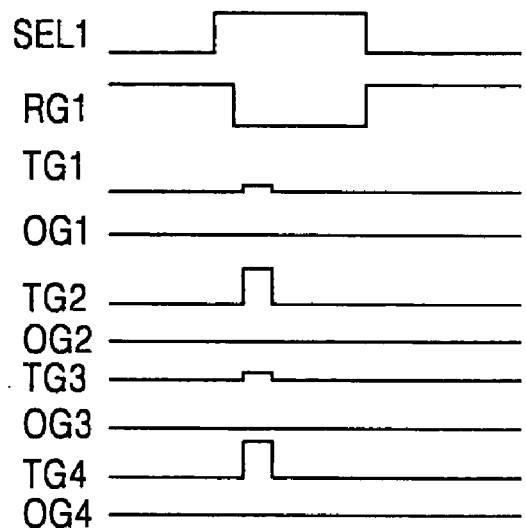

FIGS. 7A and 7B are timing charts for a pixel summation mode of an example embodiment CMOS image sensor. If a preview function is performed in an optical system including an example embodiment CMOS image sensor, a high resolution set during actual photographing may not be needed, but quick data readout may be desired, and, therefore, the pixel summation mode may be used.

As shown in FIG. 7A, if the first selection transistor 136 is turned on, photo-generated charge stored in the first FD 135 may be read, and the reset signal RG1 for controlling the first reset transistor 134 may transit to the low level. Because photo-generated charge generated by the first and third PDs 130 and 140 may be transferred to the first FD 135, the first and third transfer transistors 131 and 141 may be turned on. For this operation, the signal TG1 applied to a gate of the first transfer transistor 131 and a signal TG3 applied to a gate of the third transfer transistor 141 may be at a high level. The two transfer transistors 111 and 121 in the adjacent unit block 20 connected with the first FD 135 may be slightly turned on to prevent or reduce overflow.

Data may be simultaneously read from two unit pixels in a unit block in the pixel summation mode, and it may be desirable for two color filters in the unit block filter to be the same color.

FIG. 7B is a timing chart of an operation in which data may be simultaneously read from the second and fourth rows. The operation may be similar to that described with reference to FIG. 7A.

Figure 8A:
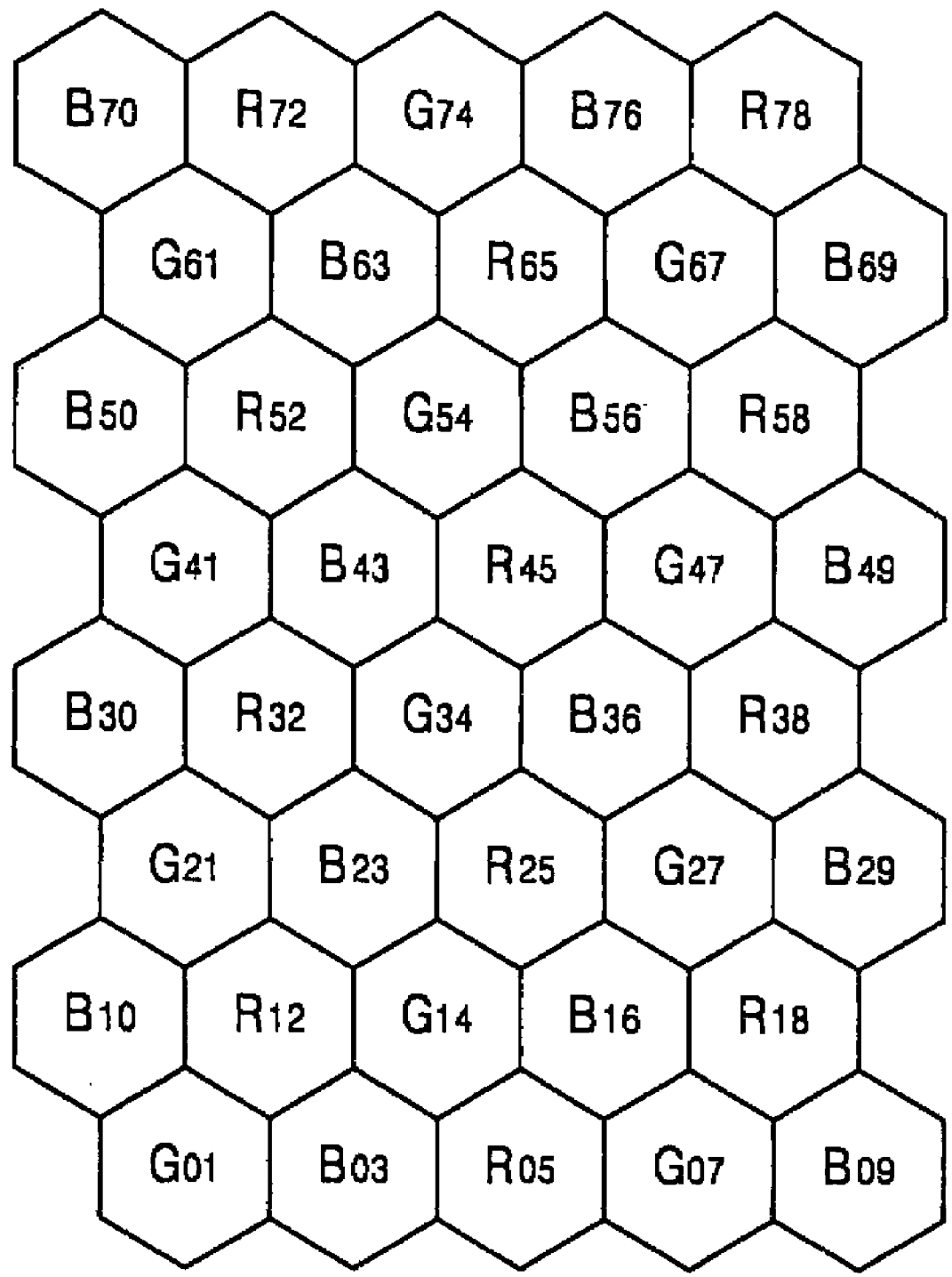
FIGS. 8A and 8B illustrate interpolation processing in a normal mode of an example embodiment CMOS image sensor.
Figure 8B:
Figure 8B:

FIGS. 8A and 8B illustrate an example embodiment method of interpolation processing in a normal mode of a CMOS image sensor. Example embodiment methods may provide interpolation processing for achieving a resolution up to about two-fold higher than the number of real pixels. FIG. 8A illustrates an example embodiment real pixel array in a CMOS image sensor. FIG. 8B illustrates a virtual pixel array after interpolation processing is performed. As shown in FIG. 8B, the number of interpolated pixels may be double the number of real pixels, for example, 80 instead of 40. During interpolation processing, a virtual pixel, represented by a blank box, may be generated between real pixels, represented by a dotted box).

Figure 9A:
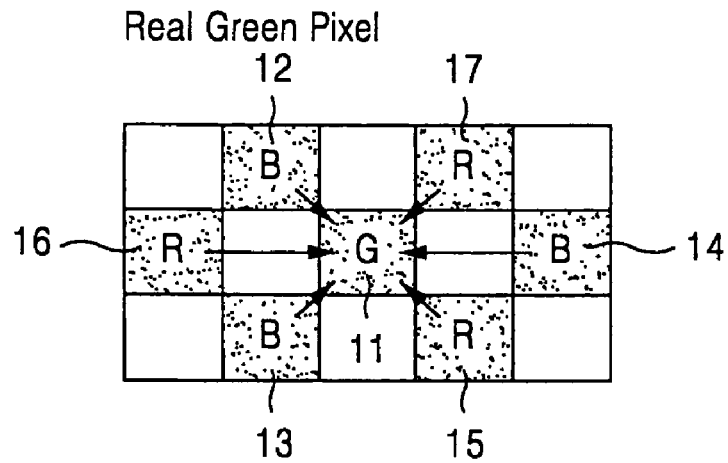
FIGS. 9A through 9F illustrate an example embodiment method of calculating a pixel value during interpolation in a normal mode of a CMOS image sensor.

FIGS. 9A through 9F illustrate an example embodiment method of calculating data values, for example, RGB values, of each pixel illustrated in FIG. 8B. As shown in FIG. 9A, a B data value of a real green pixel 11 may be generated based on data values of real blue pixels 12, 13, and 14 neighboring the real G pixel 11. For example, the sum of the data values of the real blue pixels 12, 13, and 14 may calculated and then divided by 3. An R data value of the real green pixel 11 may be generated based on data values of real red pixels 15, 16, and 17 neighboring the real green pixel 11.

Figure 9B:
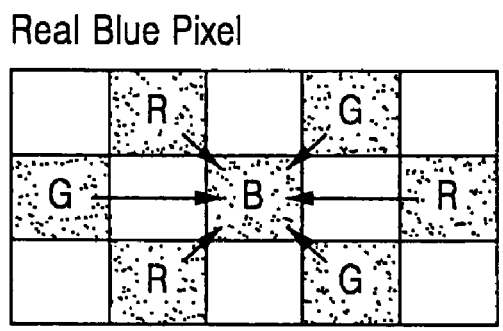
Figure 9C:
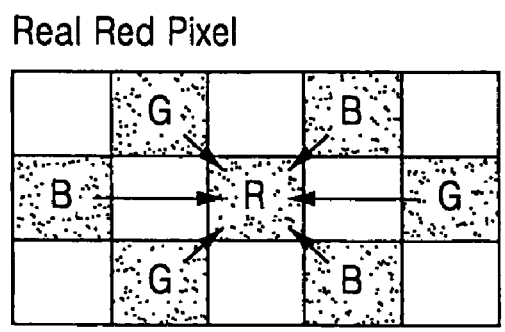

Example embodiment methods of calculating RGB values of a real blue pixel and a real red pixel, which are illustrated in FIGS. 9B and 9C, respectively, may be similar to the method illustrated in FIG. 9A.

Figure 9D:
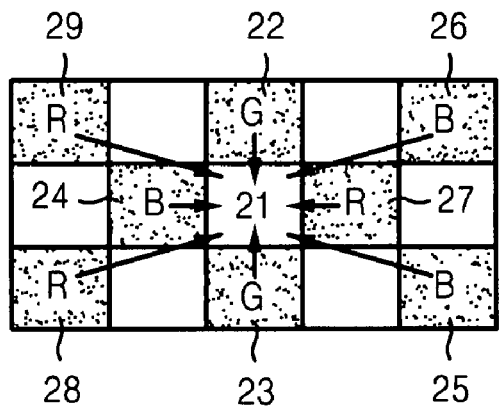

As shown in FIG. 9D, a G data value of a virtual pixel 21 between real green pixels 22 and 23 may be generated based on data values of the real green pixels 22 and 23 neighboring the virtual pixel 21. A B data value of the virtual pixel 21 may be generated based on data values of real blue pixels 24, 25, and 26 neighboring the virtual pixel 21. An R data value of the virtual pixel 21 may be generated based on data values of real red pixels 27, 28, and 29 neighboring the virtual pixel 21.

Figure 9E:
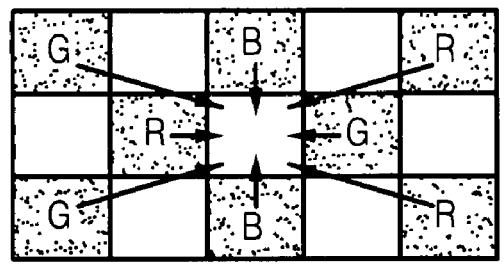
Figure 9F:
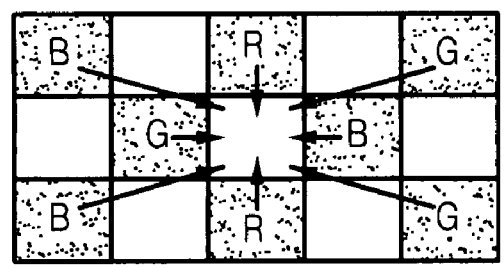

Example embodiment methods of calculating RGB values of a virtual pixel between real blue pixels and a virtual pixel between real red pixels, which are illustrated in FIGS. 9E and 9F, respectively, may be similar to the method illustrated in FIG. 9D.

Figure 10:
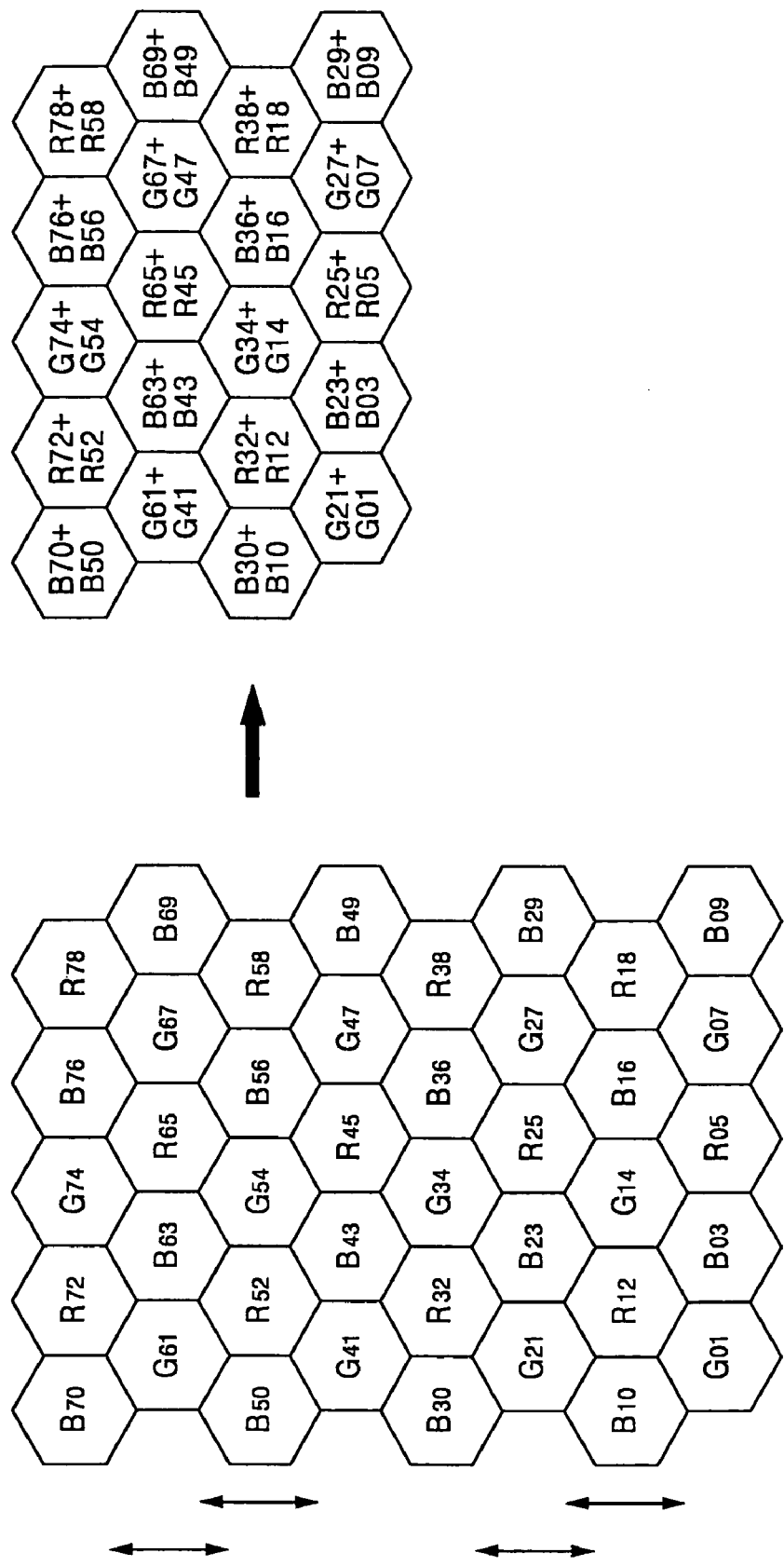
FIG. 10 illustrates an example embodiment method of interpolation processing in a pixel summation mode of a CMOS image sensor.

FIG. 10 illustrates an example embodiment method of interpolation processing in the pixel summation mode of a CMOS image sensor. As shown in FIG. 10, data of two unit pixels may be summed to generate a single data value in the pixel summation mode, in which only half of the number of all pixels in a real pixel array may exist. If the pixels obtained after pixel summation are subjected to the interpolation processing as illustrated in FIG. 8B, a resolution corresponding to the number of all pixels in the real pixel array may be generated.

Figure 11A:
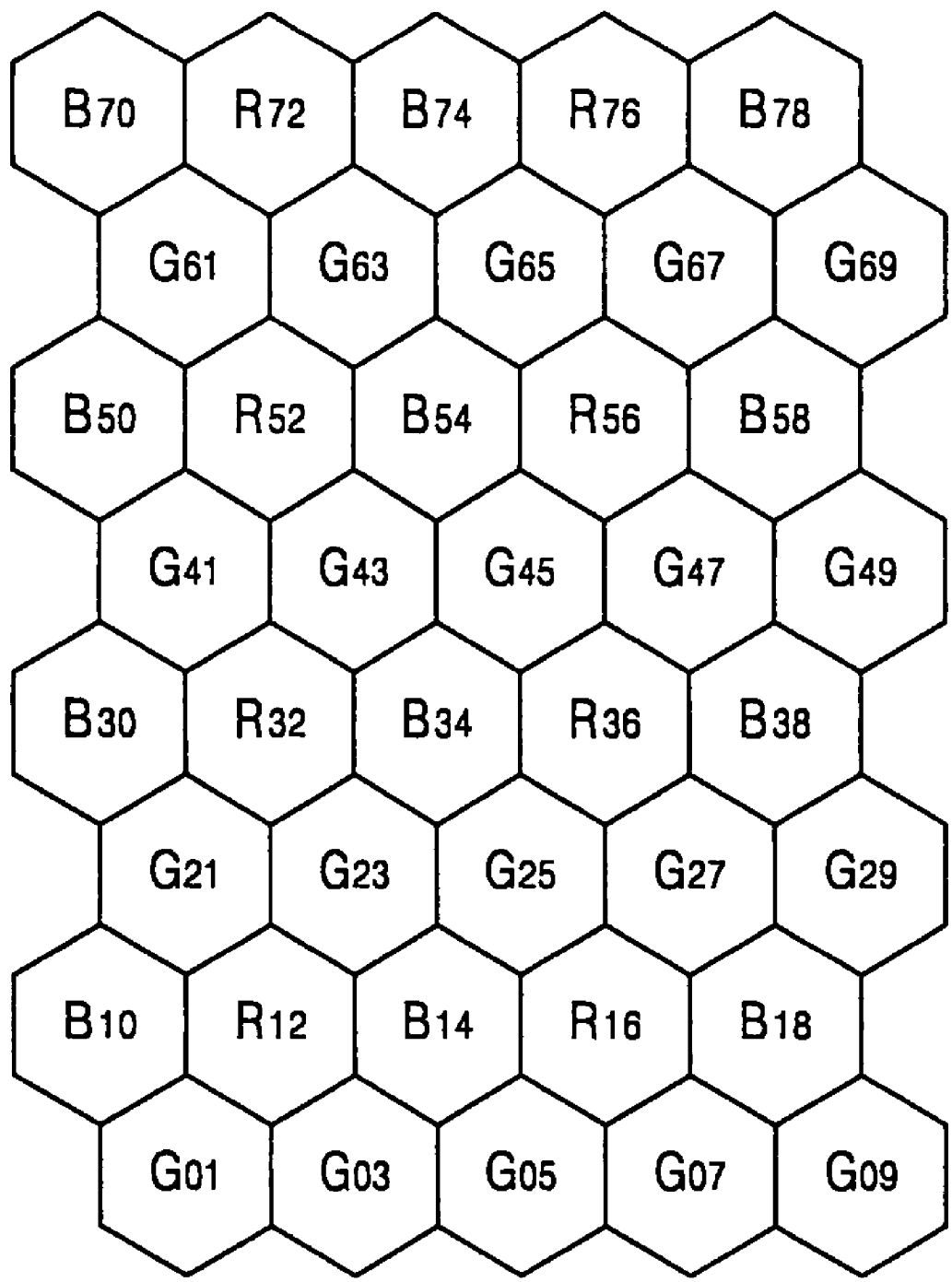
FIGS. 11A and 11B illustrate an example embodiment method of interpolation processing in a normal mode of a CMOS image sensor.
Figure 11B:
Figure 11B:

FIGS. 11A and 11B illustrate an example embodiment method of interpolation processing in a normal mode of a CMOS image sensor having the color filter layout shown in FIG. 5. The method of the interpolation processing illustrated in FIGS. 11A and 11B may be similar to that illustrated in FIGS. 8A and 8B.

Figure 12A:
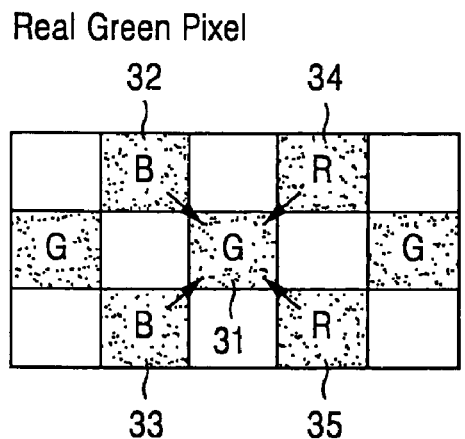
FIGS. 12A through 12F illustrate an example embodiment method of calculating a pixel value during interpolation in a normal mode of a CMOS image sensor.

FIGS. 12A through 12F illustrate an example embodiment method of calculating RGB values of each pixel during interpolation in the normal mode of a CMOS image sensor. As shown in FIG. 12A, a B data value of a real green pixel 31 may be generated based on data values of real blue pixels 32 and 33 neighboring the real green pixel 31. An R data value of the real green pixel 31 may be generated based on data values of real red, pixels 34 and 35 neighboring the real green pixel 31.

Figure 12B:
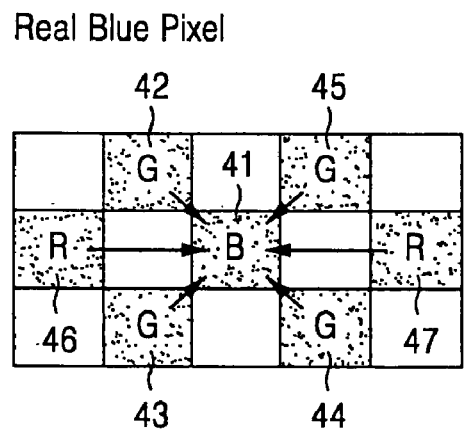

As shown in FIG. 12B, a G data value of a blue green pixel 41 may be generated based on data values of real green pixels 42, 43, 44, and 45 neighboring the real blue pixel 41. An R data value of the real blue pixel 41 may be generated based on data values of real red pixels 46 and 47 neighboring the real blue pixel 41.

Figure 12C:
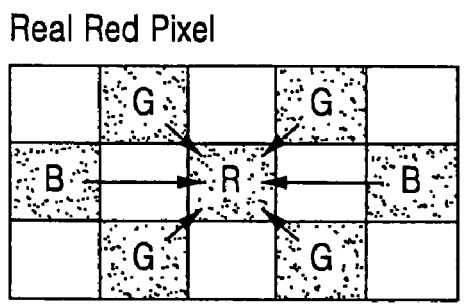

An example embodiment method of calculating RGB values of a real red pixel, which is illustrated in FIG. 12C, may be similar to the method illustrated in FIG. 12B.

Figure 12D:
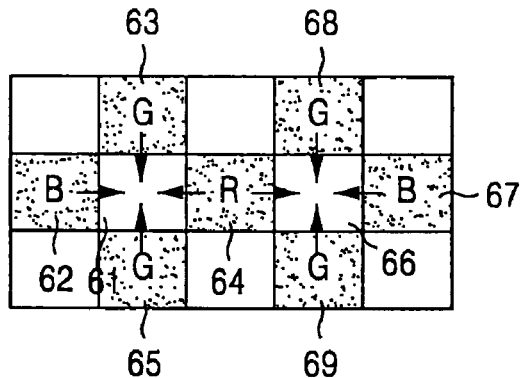

As shown in FIG. 12D, a G data value of a virtual pixel 61 or 66 between two real green pixels 63 and 65 or 68 and 69 and between a real blue pixel 62 or 67 and a real red pixel 64 may be generated based on data values of the real green pixels 63 and 65 or 68 and 69 neighboring the virtual pixel 61 or 66. A B data value of the virtual pixel 61 or 66 may be generated based on a data value of the real blue pixel 62 or 67 neighboring the virtual pixel 61 or 66. An R data value of the virtual pixel 61 or 66 may be generated based on a data value of the real red pixel 64 neighboring the virtual pixel 61 or 66.

Figure 12E:
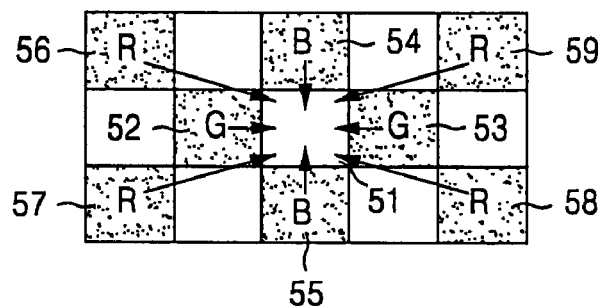

As shown in FIG. 12E, a G data value of a virtual pixel 51 between real green pixels 52 and 53 and between real blue pixels 54 and 55 may be generated based on data values of the real green pixels 52 and 53 neighboring the virtual pixel 51. A B data value of the virtual pixel 51 may be generated based on data values of the real blue pixels 54 and 55 neighboring the virtual pixel 51. An R data value of the virtual pixel 51 may be generated based on data values of real red pixels 56, 57, 58, and 59 neighboring the virtual pixel 51.

Figure 12F:
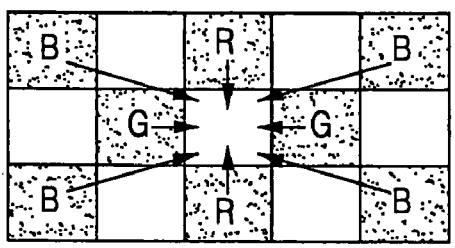

An example embodiment method of calculating RGB values of a virtual pixel between real green pixels and between real red pixels, which is illustrated in FIG. 12F, may be similar to the method illustrated in FIG. 12E.

As described above, example embodiments provide devices that may use a shared floating diffusion design in which unit pixels may share a circuit, potentially increasing the degree of integration and resolution of those devices. Example embodiments may provide a pixel summation mode and an overflow drain at a white level.

For example, an example embodiment CMOS image sensor may be used in digital cameras, computer cameras, mobile terminals, and/or any other suitable application.

While example embodiments have been particularly shown and described with reference to example embodiments thereof, it will be understood by those of ordinary skill in the art that various changes in form and details may be made therein without departing from the spirit and scope of example embodiments as defined by the following claims.

What is claimed is:

1. A CMOS image sensor having a plurality of unit blocks, each unit block of the plurality of unit blocks comprising:
    a plurality of photodiodes having a hexagonal shape, the plurality of photodiodes forming a honeycomb structure;
    two unit pixels including,
        a first unit pixel on a k-th column and an n-th row in the honeycomb structure, "k" and "n" being positive integers, and
        a second unit pixel on the k-th column and an (n+2)-th row in the honeycomb structure;
    a floating diffusion shared by the two unit pixels;
    a first transfer transistor and a second transfer transistor, each between the floating diffusion and one of the photodiodes;
    a reset transistor connected to the floating diffusion;
    a drive transistor with a gate connected to the floating diffusion; and
    a selection transistor connected with the drive transistor in series.

2. The CMOS image sensor of claim 1, wherein each unit block includes two overflow transistors, wherein a first and a second overflow transistor of the two overflow transistors are respectively connected to a first and a second photodiode, wherein the first and the second overflow transistors are configured to provide overflow drains.

3. The CMOS image sensor of claim 2, wherein the first overflow transistor of the two overflow transistors is connected with a power supply voltage and the second overflow transistor of the two overflow transistors is connected to a floating diffusion in an adjacent unit block of the plurality of unit blocks.

4. The CMOS image sensor of claim 3, wherein one of the two overflow transistors is configured to partially turn on and drain overflow in the second unit pixel during a data reading operation and wherein the first and second transfer transistors in the adjacent unit block are slightly turned on and drain overflow from the adjacent unit block.

5. The CMOS image sensor of claim 1, wherein each of the unit pixels includes a microlens above one of the photodiodes configured to receive light and a color filter between the photodiode and the microlens configured to filter the light received by the microlens.

6. The CMOS image sensor of claim 5, wherein the color filter filters the same color as the photodiodes in the unit block.

7. The CMOS image sensor of claim 6, wherein color filters for a first color, a second color, and a third color are sequenced and repeated on an n-th row in a honeycomb structure and color filters for the third color, the first color, and the second color are sequenced and repeated on an (n+1)-th row in the honeycomb structure, wherein "n" is a positive integer.

8. The CMOS image sensor of claim 6, wherein color filters for a first color and a second color are sequenced and repeated on an n-th row in a honeycomb structure and color filters for a third color are sequenced and repeated on an (n+1)-th row in the honeycomb structure, wherein "n" is a positive integer.

9. The CMOS image sensor of claim 7, wherein the first, second, and third colors are blue, red, and green, respectively.

10. The CMOS image sensor of claim 8, wherein the first, second, and third colors are blue, red, and green, respectively.

11. A CMOS image sensor having a plurality of unit blocks, each unit block of the plurality of unit blocks comprising:
 two unit pixels;
 two photodiodes having a hexagonal shape;
 a floating diffusion shared by the two unit pixels;
 a first transfer transistor and a second transfer transistor between the floating diffusion and the two photodiodes, respectively;
 a reset transistor connected to the floating diffusion;
 a drive transistor with a gate connected to the floating diffusion; and
 a selection transistor connected with the drive transistor in series, wherein a plurality of the two photodiodes having the hexagonal shape form a honeycomb structure and wherein the CMOS image sensor sums charge generated by the two photodiodes in each unit block of the plurality of unit blocks and outputs a voltage generated by the summed charge as an output voltage during a reading operation on each unit block of the plurality of unit blocks to support a pixel summation mode.

12. The CMOS image sensor of claim 11, wherein each unit block of the plurality of unit blocks further includes two overflow transistors, wherein a first and a second overflow transistor of the two overflow transistors are respectively connected to a first and a second photodiode of the two photodiodes, wherein the first and the second overflow transistors are configured to provide overflow drains, and wherein one transistor of the two overflow transistors is connected with a power supply voltage, and another transistor of the two overflow transistors is connected with a floating diffusion in an adjacent unit block of the plurality of unit blocks.

13. The CMOS image sensor of claim 12, wherein the first and second transfer transistors in the adjacent unit block are configured to slightly turned on to and drain overflow during a reading operation in the adjacent unit block to support the pixel summation mode.

14. A digital camera comprising:
 the CMOS image sensor of claim 1; and
 an image processor receiving data output from the CMOS image sensor and performing image processing of the received data.

15. A digital camera comprising:
 the CMOS image sensor of claim 11; and
 an image processor receiving data output from the CMOS image sensor and performing image processing of the received data.

16. A computer camera comprising:
 the CMOS image sensor of claim 1; and
 an image processor receiving data output from the CMOS image sensor and performing image processing of the received data.

17. A computer camera comprising:
 the CMOS image sensor of claim 11; and
 an image processor receiving data output from the CMOS image sensor and performing image processing of the received data.

18. A mobile terminal comprising:
 the CMOS image sensor of claim 1; and
 an image processor receiving data output from the CMOS image sensor and performing image processing of the received data.

19. A mobile terminal comprising:
 the CMOS image sensor of claim 11; and
 an image processor receiving data output from the CMOS image sensor and performing image processing of the received data.

20. An image sensing method for a CMOS image sensor comprising:
 selecting a first unit pixel;
 transferring charge generated by a photodiode in the first unit pixel to a first floating diffusion in a unit block including the first unit pixel;
 transferring an amount of charge generated by photodiodes in two unit pixels in a first adjacent unit block connected to the first floating diffusion to a second floating diffusion in the first adjacent unit block to drain overflow;
 transferring an amount of charge generated by a photodiode in a second unit pixel to a power supply voltage or a floating diffusion in a second adjacent unit block to drain overflow; and
 reading charge from the first floating diffusion.

21. An image sensing method for a CMOS image sensor comprising:
 selecting a unit block;
 transferring charge generated by two photodiodes in the selected unit block to a first floating diffusion in the unit block;
 transferring an amount of charge generated by photodiodes in two unit pixels in an adjacent unit block connected to the first floating diffusion to a second floating diffusion in the adjacent unit block; and
 reading charge from the first floating diffusion.

* * * * *